US006974743B2

(12) United States Patent
Divakaruni et al.

(10) Patent No.: US 6,974,743 B2
(45) Date of Patent: Dec. 13, 2005

(54) METHOD OF MAKING ENCAPSULATED SPACERS IN VERTICAL PASS GATE DRAM AND DAMASCENE LOGIC GATES

(75) Inventors: Ramac Divakaruni, Ossining, NY (US); Stephan Kudelka, Ottendorf-Okvilla (DE); Jack Mandelman, Flat Rock, NC (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/770,264

(22) Filed: Feb. 2, 2004

(65) Prior Publication Data

US 2005/0167741 A1    Aug. 4, 2005

(51) Int. Cl.[7] ............................................. H01L 27/108
(52) U.S. Cl. .................... 438/238; 438/239; 438/386; 438/242; 438/399; 438/361; 438/430
(58) Field of Search ............................. 438/238, 239, 438/386, 242, 399, 361, 430

(56) References Cited

Primary Examiner—Fetsum Abraham
(74) Attorney, Agent, or Firm—Slater & Matsil, L.L.P.

(57) ABSTRACT

Semiconductor devices having improved isolation are provided along with methods of fabricating such semiconductor devices. The improved isolation includes an encapsulated spacer formed within a gate region of a device.

13 Claims, 16 Drawing Sheets

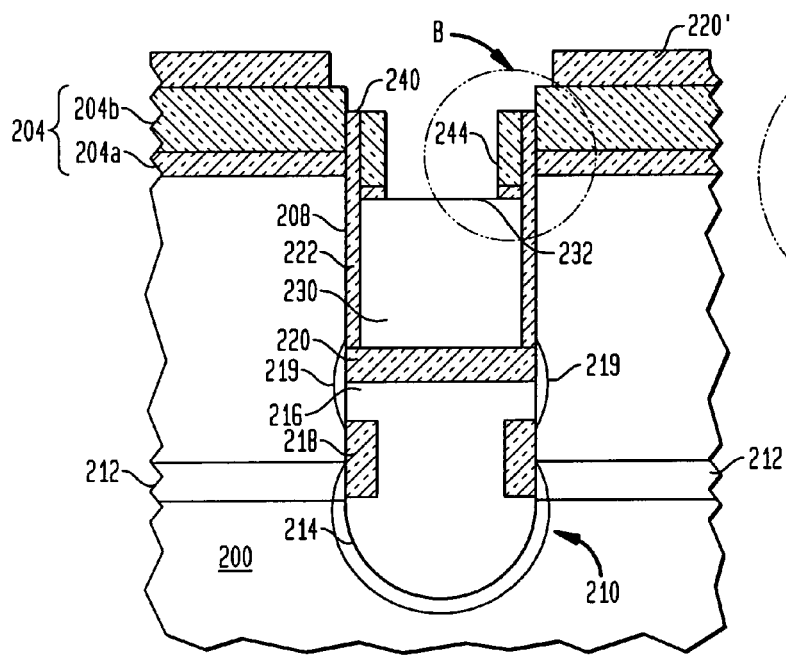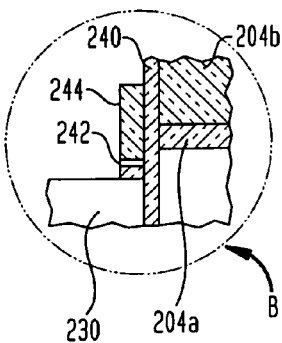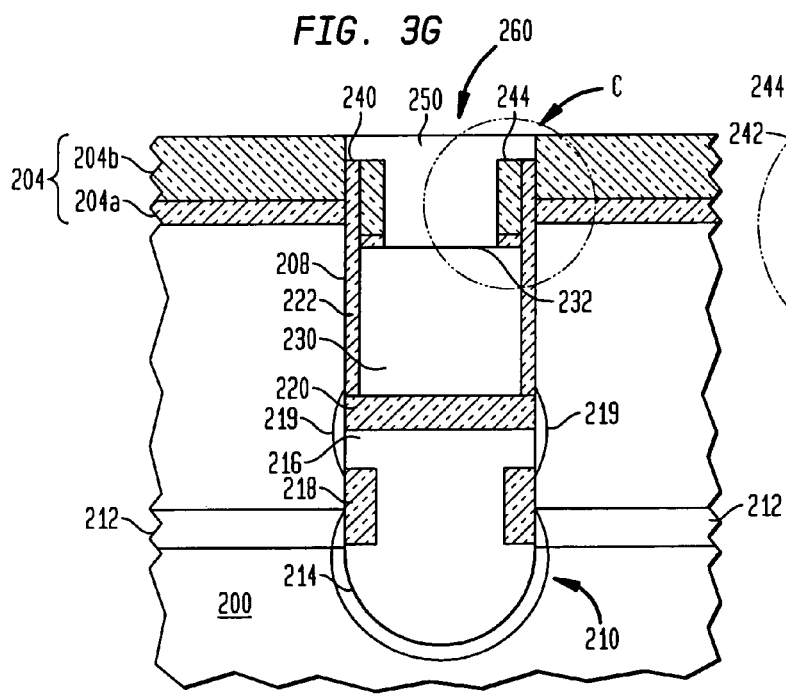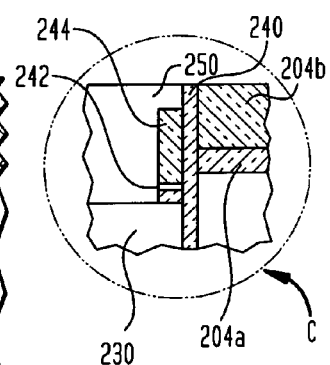

METHOD OF MAKING ENCAPSULATED SPACERS IN VERTICAL PASS GATE DRAM AND DAMASCENE LOGIC GATES

BACKGROUND OF THE INVENTION

The present invention relates to semiconductor devices and, more particularly, relates to improved isolation for semiconductor devices.

Semiconductor devices are employed in various systems for a wide range of applications. An important type of semiconductor device is the transistor. Transistors are ubiquitous in electronics and are often used as part of larger devices or systems. For example, transistors may form part of a logic device or may be used to create memory cells such as dynamic random access memory ("DRAM").

A simple DRAM cell may include one transistor and one capacitor formed on or within a semiconductor substrate. A DRAM cell formed on the semiconductor substrate is known as a stacked memory cell, and a DRAM cell formed within the semiconductor substrate is known as a trench memory cell. The capacitor stores a charge to represent a data value. The transistor allows the data value to be refreshed, read from, or written to the capacitor.

FIG. 1 illustrates a conventional DRAM memory cell 100 including a capacitor 110 and a transistor 120. The capacitor 110 includes a first electrode 112 and a second electrode 114, which are typically separated by a dielectric (not shown). The transistor 120 includes a source (or drain) 122 connected to the second electrode 114. The transistor 120 also includes a drain (or source) region 124 connected to a bit line 132, as well as a gate region 126 connected to a word line 130. The data may be refreshed, read from or written to the capacitor 110 by applying appropriate voltage to the bit line 132 and/or the word line 130.

A series of DRAM cells or logic devices are typically formed together in a memory chip or in a chip with an embedded memory. One method of forming more memory cells or logic devices is to reduce the size of each device. As device size decreases, for example, the memory capacity of a DRAM chip increases. However, decreasing the size of the device or portions of the device can have adverse consequences. For instance, in a trench memory cell, misalignment may occur between the word line and the edge of the trench. The misalignment commonly leads to increased cell leakage caused by leakage between the source and drain regions. The leakage between the source and drain of the transistor is present in both stacked and trench DRAMs.

A key challenge to the continued scaling or increased density of memory calls is to maintain low leakage between source and drain of the pass transistor 120 so that charge from the capacitor 110 does not leak before it is refreshed. Vertical transistors have thus been proposed in both stacked and trench DRAM cells which utilize the third (vertical) dimension to decouple the pass transistor gate length from the dimensions on the surface of the ship. This decoupling allows for increased density of the memory cells by burying the source/drain 12 below the silicon surface. In the case of stacked cell, the bit line is buried i.e., the junction 124 is buried whereas for a trench cell the capacitor is buried i.e., the junction 122 is buried.

In present DRAMS, high density is achieved by making the bit line contact to 124 borderless to the word line 130 of a trench DRAM cell. For stacked DRAMs, the contacts are borderless to the word line 130. For DRAMS with vertical transistors, the bit line contact or the stacked capacitor contact must also be borderless to the vertical gate polysilicon. Consequently, inner spacers have been proposed. It is therefore desirable to provide a process for making such inner spacers.

The presence of leakage between source and drain is also a problem for conventional logic chips. In addition, logic chips also suffer from increased leakage through the gate insulator. Raised source-drain structures have been proposed to deal with the first problem but usually call for epitaxially growing Si in the source-drain region which is prone to defects. Accordingly, high-K gate dielectrics have been proposed to address the problem of increased gate leakage, but such dielectrics are better utilized with a non-conventional damascene formed gate structure. It is thus desirable to provide a structure and a method of forming defect-free raised source-drains with high-K gate dielectrics and damascene formed gates on logic chips.

U.S. Pat. No. 5,998,835 to Furukawa et al. describes a known raised-source drain structure but does not teach encapsulated spacers or damascene gates on the high-K gate dielectrics. The disclosure is incorporated herein by reference. Thus, a need nevertheless exists for semiconductor devices having improved isolation.

SUMMARY OF THE INVENTION

The present invention provides devices having encapsulated spacers to improve their structural integrity.

In accordance with an aspect of the invention, semiconductor devices are provided in a substrate. A gate area is defined in the substrate. The gate area has a sidewall extending into the substrate. A gate material is formed within the gate area and has a top surface. A sidewall and the top surface are oxidized. A spacer is formed within the gate area adjacent to the oxidized sidewall and a portion of the oxidized top surface. Segments of the oxidized sidewall and the oxidized top surface that are not covered by the spacer are then removed. The spacer and remaining portions of the oxidized sidewall and the oxidized top surface form an encapsulated spacer.

Optionally, sputtered silicon is formed over the oxidized sidewall and the oxidized top surface prior to forming the spacer. Preferably, the spacer comprises a nitride and may be formed by first depositing the nitride within the gate area and then performing an etch back that is selective to the oxide.

In accordance with another aspect of the invention, a semiconductor device is provided. A substrate has a trench formed within the substrate and a transistor. The trench is defined by sidewalls extending into the substrate. The transistor includes a source region, a drain region and a gate region. The source region is formed in the substrate proximate to a first one of the sidewalls. The drain region is formed within the substrate. The gate region is formed substantially within the trench and provides electrical contact between the source region and the drain region. The gate region includes the gate conductor, an encapsulated spacer and a gate contact. The gate conductor is formed in a lower portion of the trench and has an upper surface. The encapsulated spacer has an oxidized portion and a spacer portion. The oxidized portion is disposed along an upper segment of the sidewalls and along a segment of the upper surface. The spacer portion is disposed adjacent to the oxidized portion within the trench, and the gate contact is formed over an exposed portion of the upper surface and substantially covers the encapsulated spacer. Optionally, the semiconductor device may include a silicon liner disposed between the oxidized portion and the spacer portion.

In accordance with yet another aspect of the invention, a semiconductor device is provided in a substrate. A gate area is defined in the substrate and has sidewalls and a bottom linking the sidewalls. The sidewalls extend into the substrate. A doped material is deposited within the gate area. The doped material is formed along a first one of the sidewalls and over an adjacent portion of the bottom. Dopant is diffused from the doped material into the substrate. After diffusion, the doped material is removed. Exposed portions of the sidewalls and the bottom of the gate area are oxidized. A spacer is formed within the gate area and covers a segment of one of the oxidized sidewalls as well as a segment of the oxidized bottom. Portions of the oxidized sidewalls and the oxidized bottom that are not covered by the spacer are removed. The spacer and the oxidized sidewalls and the oxidized bottom which remain form an encapsulated spacer.

Preferably, a threshold voltage adjust implant is applied to the substrate through the bottom of the gate area after the dopant has been diffused. A gate dielectric is preferably formed over the bottom of the gate area after any oxidized portion has been removed. A gate conductor may be formed within the gate area over the gate dielectric. An exterior spacer may be formed adjacent to each of the oxidized sidewalls, and source and drain regions may be formed in the substrate on either side of the gate area.

In accordance with still another aspect of the invention, a semiconductor device is provided and includes a substrate and a transistor. The substrate has a recess formed therein, the recess being defined by sidewalls and a bottom. The sidewalls extend into the substrate. The transistor includes a source region, drain region and a gate region. The source region is formed in the substrate proximate to a first one of the sidewalls. The drain region is formed within the substrate proximate to a second one of the sidewalls. The gate region is formed partly within the recess and provides electrical contact between the source region and the drain region. The gate region includes a gate conductor, an encapsulated spacer and a gate dielectric. The gate dielectric is formed along a central portion of the bottom. The encapsulated spacer has an oxidized portion and a spacer portion. The oxidized portion is disposed along an upper segment of the sidewalls and along a segment of the bottom adjacent to the central portion. The spacer portion is disposed adjacent to the oxidized portion within the recess. The gate conductor is formed over the gate dielectric and substantially covers the encapsulated spacer.

Preferably, the semiconductor device includes a dopant disposed within the substrate proximate to the encapsulated spacer. The semiconductor device may also include extension implants which electrically connect a source and drain regions to the dopant.

BRIEF DESCRIPTION OF THE DRAWINGS

FIGS. 3A–3H are schematic cross-sectional views illustrating steps of process for fabricating the device shown in FIG. 2 in accordance with the invention.

FIGS. 4–8 are cross-sectional views illustrating optional steps in the process of FIGS. 3A–3H.

DETAILED DESCRIPTION

In accordance with an embodiment of the present invention, a memory cell having improved isolation is provided. The materials and processes described below can be employed with various kinds of substrates including, but not limited to, silicon (Si) and silicon on insulator (SOI). It is to be appreciated that the values of temperature, pressure, time, dimensions, etc. are by way of example only and are approximations that may be varied. It will also be apparent to one of ordinary skill in the art that certain steps may be performed in a different order.

Figure 1:
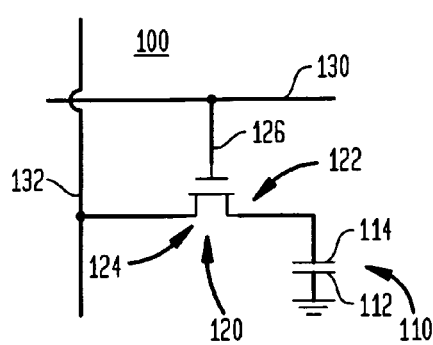
FIG. 1 depicts a conventional DRAM memory cell.
Figure 2:
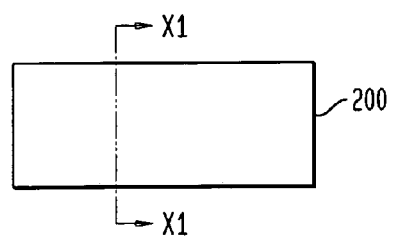
FIG. 2 illustrates a top view of a semiconductor device in accordance with the invention.

FIG. 2 is a top view of a part of a memory cell formed in a semiconductor substrate. A process for forming the memory cell is described using cross-sectional views in FIGS. 3A–3H. The cross-sectional views are taken with respect to the line $X_1$—$X_1$ shown in FIG. 2.

Figure 3A:
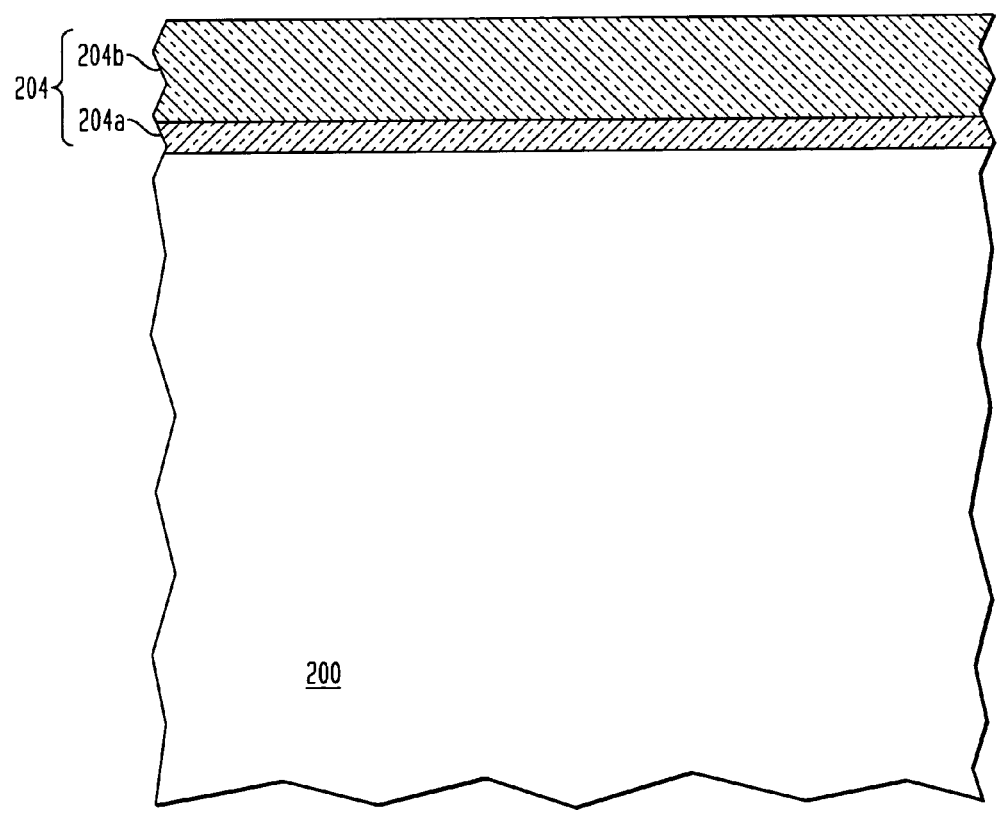

FIG. 3A illustrates a step in a process for fabricating a memory cell in accordance with an aspect of the invention. Disposed on top of a substrate 200 is a pad stack 204 which may comprise a pad oxide 204A and a pad nitride 204B. Typically, the pad oxide 204A is thermally grown on the semiconductor substrate 200. The thickness of the pad oxide 204A is preferably about 50 Å but may range from 20 Å to 80 Å. The pad nitride 204B comprises silicon nitride, hereinafter referred to as "nitride", which may be deposited in a manner known in the art. The thickness of the pad nitride 204B is preferably on the order of 2000 Å but may range from 1500 Å to 2500 Å.

Figure 3B:
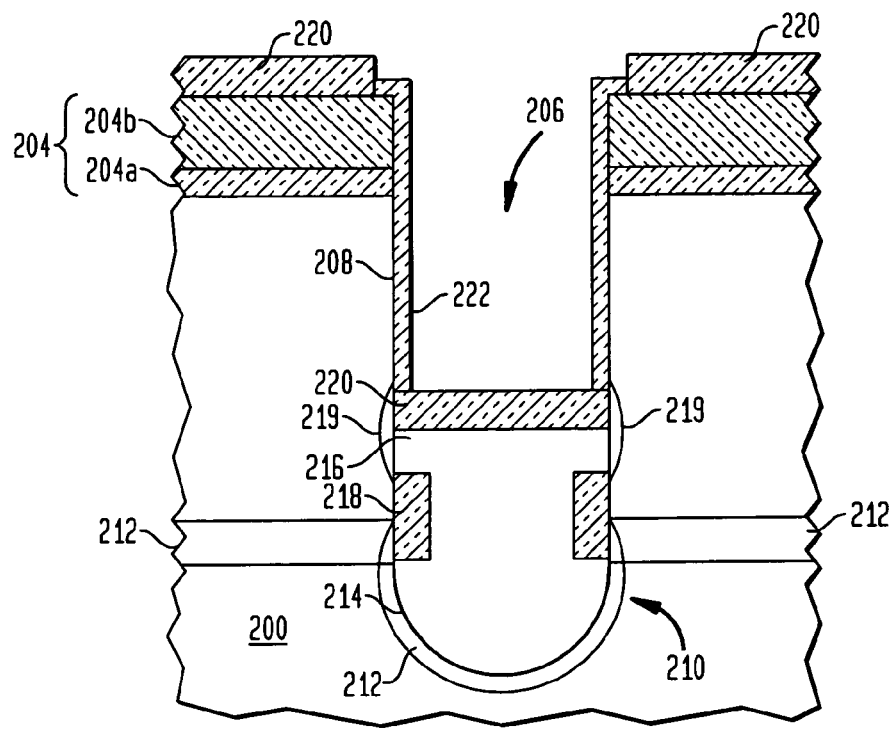

After deposition of the pad stack 204, a trench 206 is formed in the substrate 200, as FIG. 3B illustrates. The trench 206 is defined by sidewalls 208 and a bottom that are formed in the substrate 200. Typically, the sidewalls 208 are substantially parallel and the bottom of the trench is rounded. However, one of ordinary skill in the art of manufacturing semiconductor trench devices may provide trenches having different shapes. For instance, the trench 206 may have a bottle shape or other geometric shape. The trench 206 may be formed by a process step known in the art, such as by reactive ion etching ("RIE") techniques.

After the trench 206 has been formed in the substrate 200, a capacitor 210 is formed in a lower portion of the trench 206. The capacitor 210 comprises an outer electrode 212, a node dielectric 214 and an inner electrode 216. The outer electrode 212, also known as a "buried plate", is a doped region formed in a portion of the semiconductor substrate 200 that surrounds the lower portion of the trench 206. Preferably, the dopant is an n-type species, such as arsenic, antimony or phosphorus. Preferably, the dopant is provided by a gas or by an As-doped glass that is diffused into the semiconductor substrate 200 to a concentration of between about $1 \times 10^{19}$ and $1 \times 10^{21}$ atoms per $cm^3$. Generally, the dopant concentration is as high as possible, subject to manufacturing limitations.

After the outer electrode 212 is formed, a dielectric liner, known as the "node dielectric" 214, is formed along the sidewalls 208 in the lower portion of the trench 206. The node dielectric 214 is typically a combination of nitridized Si, SiN and reoxidized SiN. "High K" materials, which have a dielectric constant greater than the silicon dioxide ($SiO_2$) dielectric constant of approximately 3.9, may also be used.

A preferred dielectric material is aluminum oxide ($Al_2O_3$) which has a dielectric constant of between 5 to 10. Additional dielectric materials may be employed in place of $Al_2O_3$ provided they hold up to the temperature of subsequent process steps. The process for forming the node dielectric 214 depends on the materials used.

After formation of the node dielectric 214, a collar 218 may be formed within the top portion of the trench 206. The collar is typically used to lower the vertical parasitic leakage between a buried strap 219 and the buried plate 212. The buried strap 219 is formed by out-diffusion of n-type dopant from the trench polysilicon 216 into the p-type silicon substrate. The collar 218 is preferably an oxide which may be formed by a deposition on the sidewalls 208.

Next, an inner electrode 216 may be created by substantially filling the lower portion of the trench 206 with a capacitor fill material. The capacitor fill material is preferably polycrystalline silicon, known as polysilicon or poly-Si, doped with arsenic that is preferably deposited using LPCVD or a similar process. Initially, the capacitor fill material may substantially fill the entire trench 206 and is then recessed in a subsequent processing step.

Then, a trench top oxide ("TTO") layer 220 may be formed over the capacitor fill material. The TTO layer 220 isolates the capacitor 210 from other portions of the semiconductor device and from deposits on the surface of the nitride. After the TTO 220 has been formed, a gate oxide 222 is formed along the sidewalls 208 in an upper portion of the trench 206. The vertical gate oxide 222 is also formed along the pad stack 204 on either side of the trench 206. The gate oxide 222 may be formed by an in-situ steam-generated (ISSG) rapid thermal oxidation (RTO) process.

Figure 4:
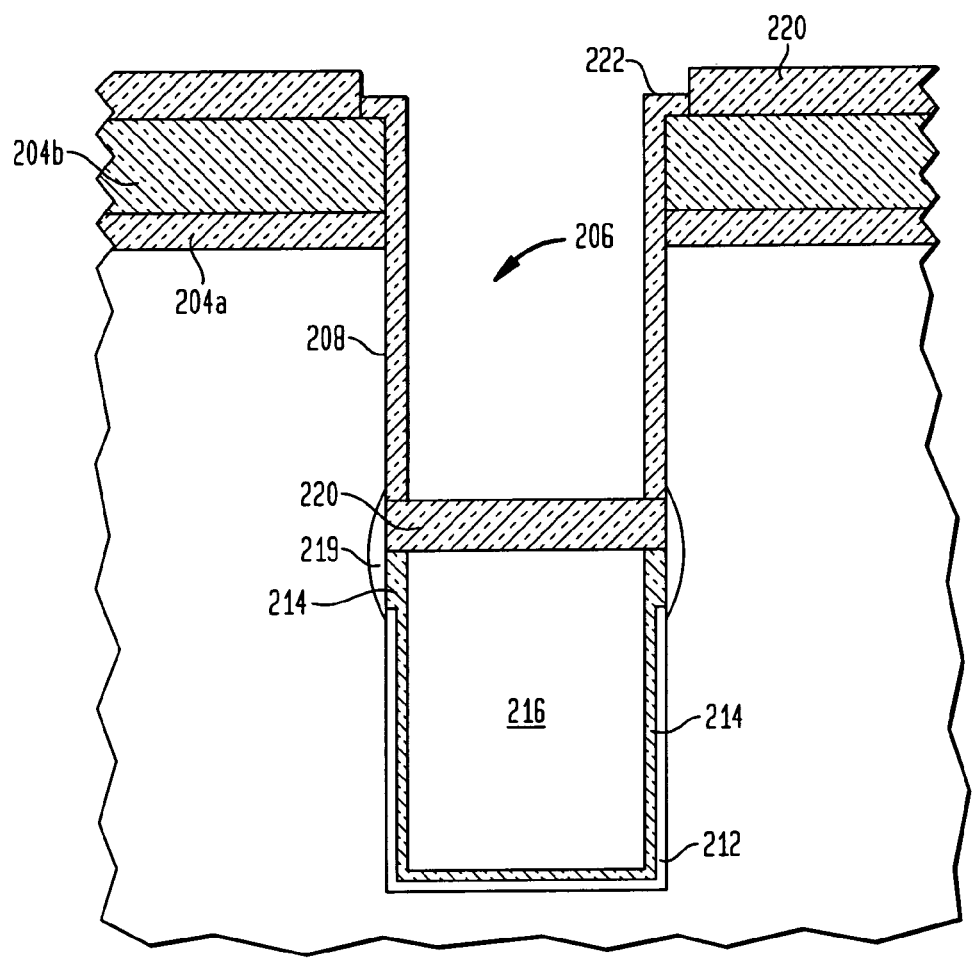

FIG. 4 shows an alternative structure for stacked DRAM cells wherein the bottom part of the trench 206 includes a buried bit line 216 and an oxide liner 214, which are either polysilicon or a polysilicon liner with a metal such as WN, $WSi_x$ or others known in the art.

Figure 3C:
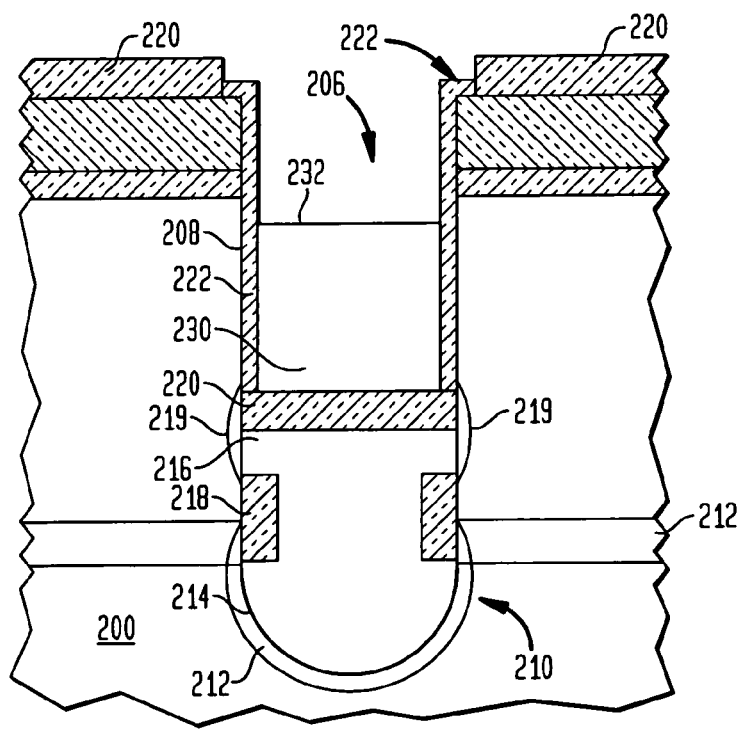

FIG. 3C illustrates a further process step wherein a gate conductor 230 having an upper surface 232 is formed within the trench 206. The gate conductor 230, also known as a "vertical gate", preferably comprises doped polysilicon deposited by LPCVD techniques, as is known in the art. The upper surface 232 may be recessed to a level below the pad stack 204, typically to a depth of between 20 nm to 80 nm.

Figure 3D:
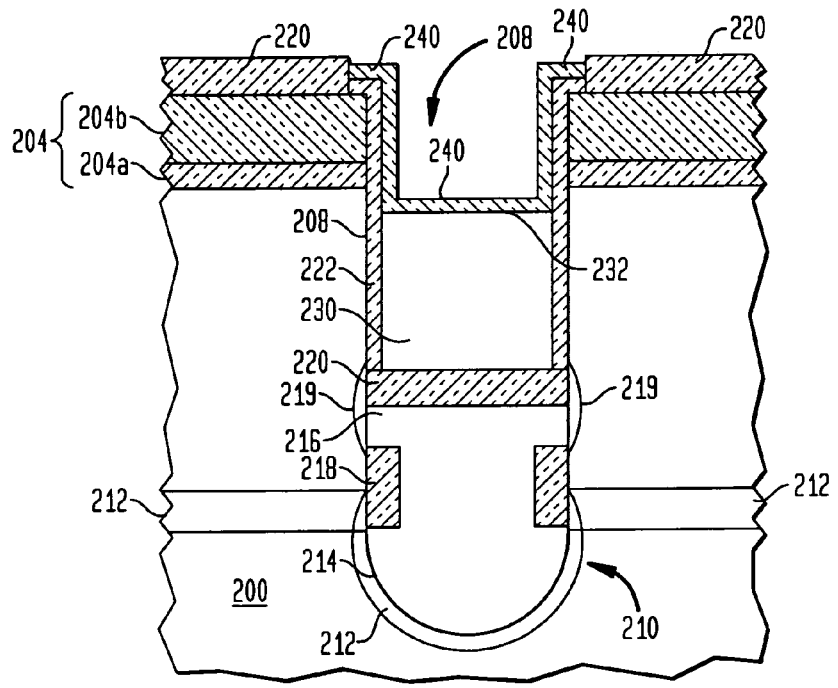

FIG. 3D illustrates a subsequent step wherein the upper surface 232 of the gate conductor 230 is oxidized along with exposed surfaces of the pad stack 204 to form an oxide layer 240. The oxidation process is preferably performed using rapid thermal oxidation, which oxidizes both the pad nitride 204B and the exposed silicon/polysilicon as is described in the art. The oxidation is done in an atmosphere of hydrogen and oxygen at temperatures between 100° C. to 1100° C.

Figure 5:
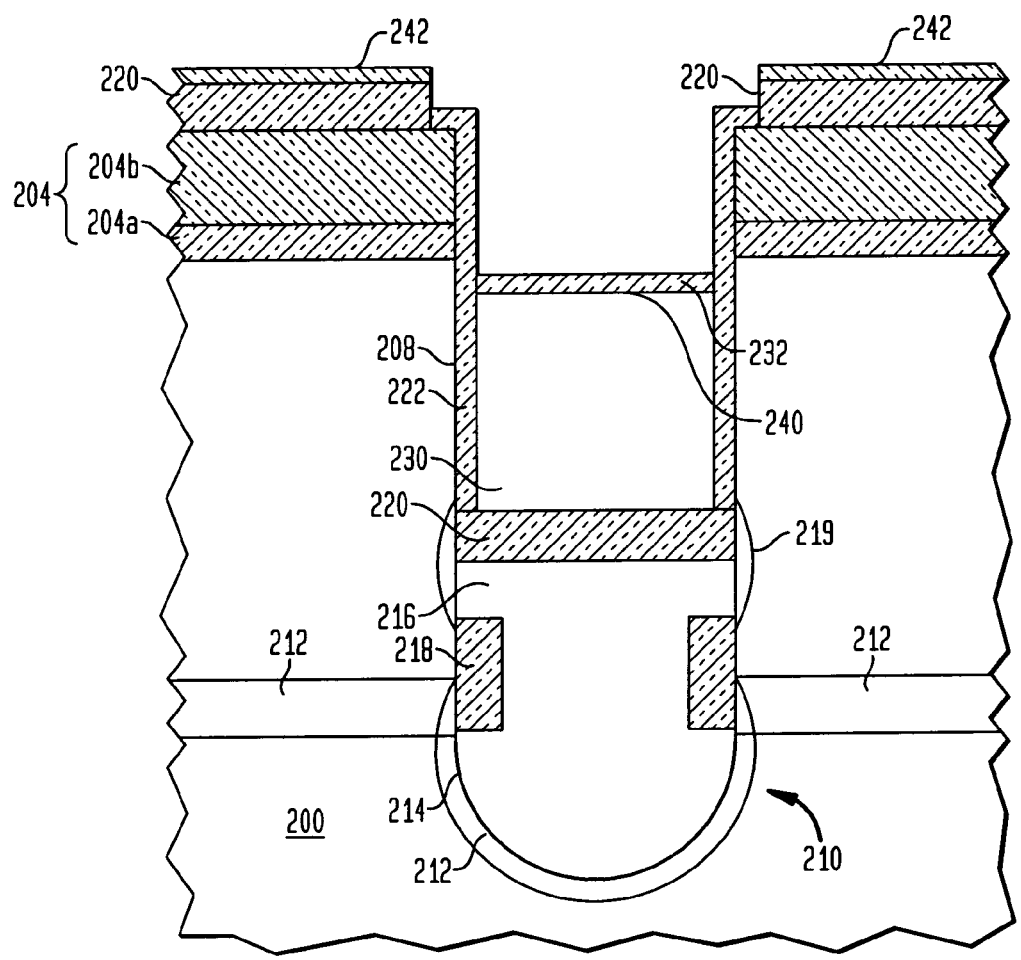

FIG. 5 illustrates an optional step that may be performed after the above oxidation step. Silicon sputtering may be carried out to deposit a silicon layer 242 that is disposed over the oxide layer 240 but which is formed only parallel to the surface but not along the sidewalls. The sputtering is a physical vapor deposition ("PVD") process which bombards a solid with high energy ions of, e.g., argon. The bombardment dislodges some of the atoms from the solid. The dislodged atoms then redeposit onto a target surface, such as the surface of the oxide 240. The Si sputtering process is known in the art.

Figure 3E:
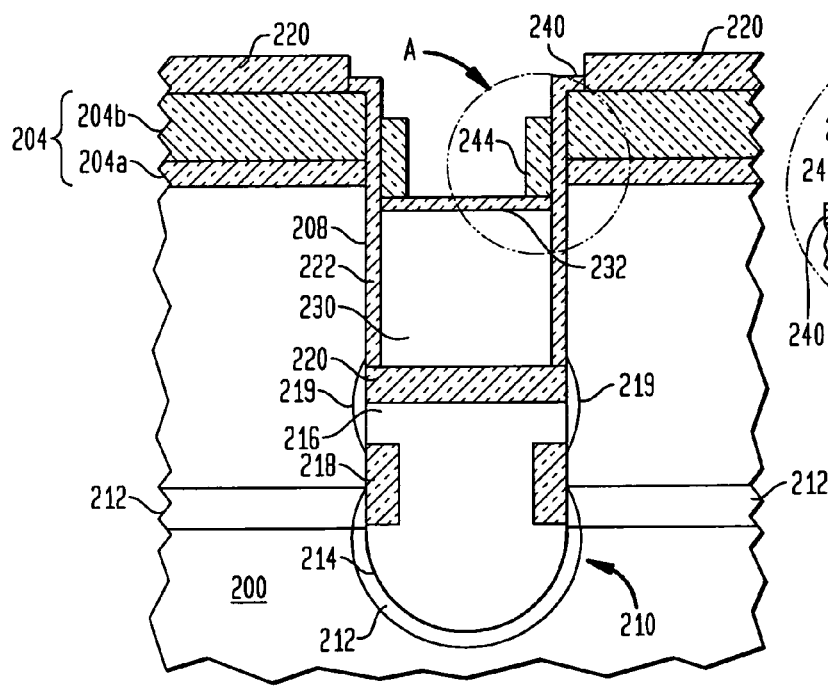

FIG. 3E illustrates a step following the oxidation described with regard to FIG. 3D. Spacers 244 are preferably deposited or otherwise formed within the trench 206. Specifically, the spacers 244 are formed adjacent to the oxidized pad stack 204 and the upper surface 232 of the gate conductor 230. Preferably, the spacers 244 comprise a nitride material. The spacers are deposited by standard LPCVD or RTCVD processes and are etched by standard RIE techniques. After the spacers 244 have been formed, they may be etched back. The etch back, or "overetch", is selective to the oxide or the silicon. The overetch preferably etches the spacer 244 to a height below the top of the pad nitride 204B.

Figure 6:
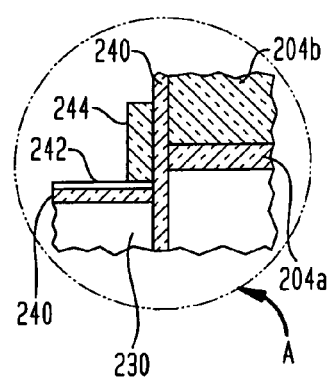

FIG. 6 illustrates an optional subsequent step wherein the spacer 244 is formed over the silicon liner 242 as depicted in a region A which corresponds to a region A shown in FIG. 3E.

FIG. 3F illustrates a process step subsequent to the step shown in FIG. 3G. After the oxide 240 has been stripped, a thin remnant of TTO 220 remains atop of the SiN layer 204b. Here, the oxide 240 has been removed except where it has been covered by the spacer 244. The oxide stripping process is done in a conventional HF-based wet etch.

FIG. 7 illustrates an optional step wherein the oxide removal occurs only on the sidewall 242 and protects the TTO 220 atop layer 204 from being etched as shown in region B which corresponds to region B shown in FIG. 3F.

FIG. 3G illustrates another step where the trench 206 has been filled with an additional gate material 250. The additional gate material 250 is preferably of the same composition as the gate conductor 230 e.g., doped polysilicon. The additional gate material 250 may be deposited in the same manner that the gate conductor 230 is deposited within the trench 206. The gate conductor 230, the gate oxide 222, the additional gate material 250, the oxide 240 and the spacers 244 define a gate region 260. After deposition, the additional gate material 250 is preferably planarized, such as using chemical mechanical polishing ("CMP"), and the polysilicon 250 and the remaining TTO 220 are polished down to the pad layer 204b.

FIG. 8 illustrates an optional step showing the formation of the additional gate material 250 when the spacer 244 has been formed over the sputtered silicon 242 as shown in region C which corresponds to region C shown in FIG. 3G.

Figure 3H:
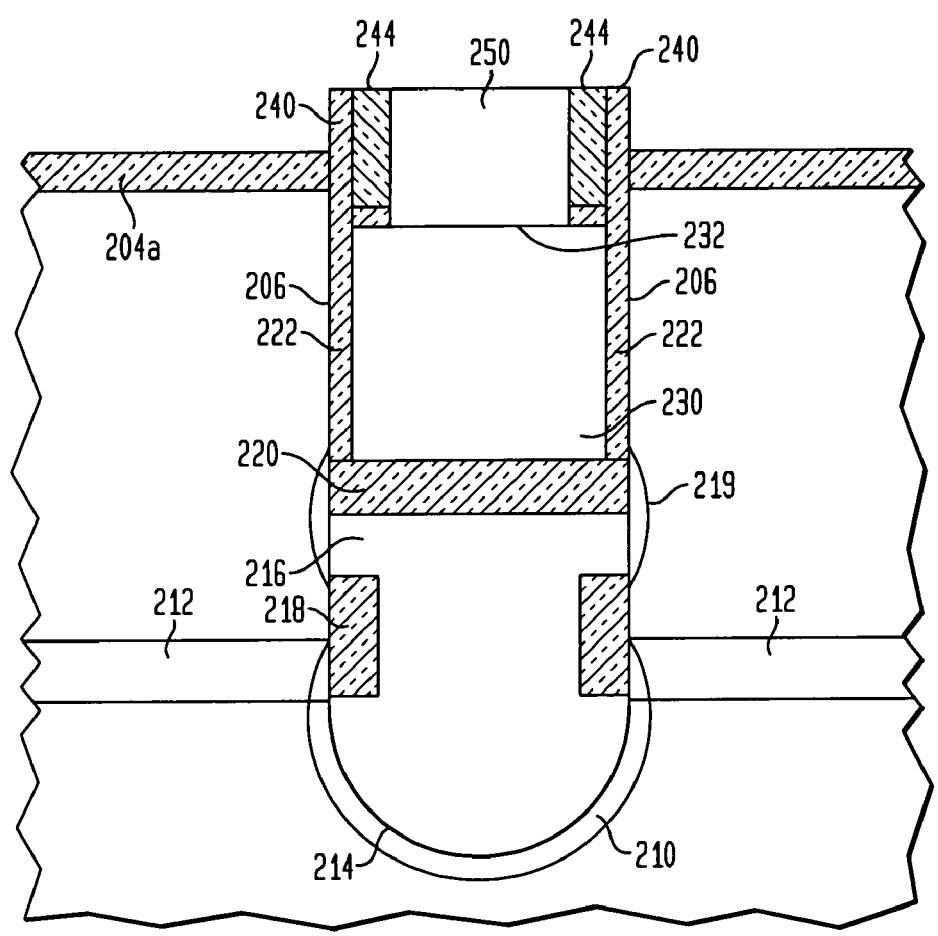

FIG. 3H illustrates a subsequent step in which the pad SiN layer 204b is removed by a wet etch in hot phosphoric acid after the isolation process. The inner spacer 244 is protected from the hot phosphoric acid etch which removes the pad SiN 204b near the top poly 250 and also removes the oxide 240 on the sidewall. Consequently, the SiN encapsulated spacers remain throughout the rest of the processing, as is known in the art. The spacers improve the margin for word line-to-bit line shorts in the vertical transistor DRAM.

While the enhanced isolation of the present invention has been described above with regard to trench memory cells, the invention is not so limited. In accordance with another embodiment of the present invention, a semiconductor logic device having improved isolation is provided. As with the memory devices of FIGS. 3A–3H, the materials and processes described below may be employed with various kinds of substrates. Furthermore, the numbers used are approximations and may be varied and certain steps may be performed in a different order.

Figure 9:
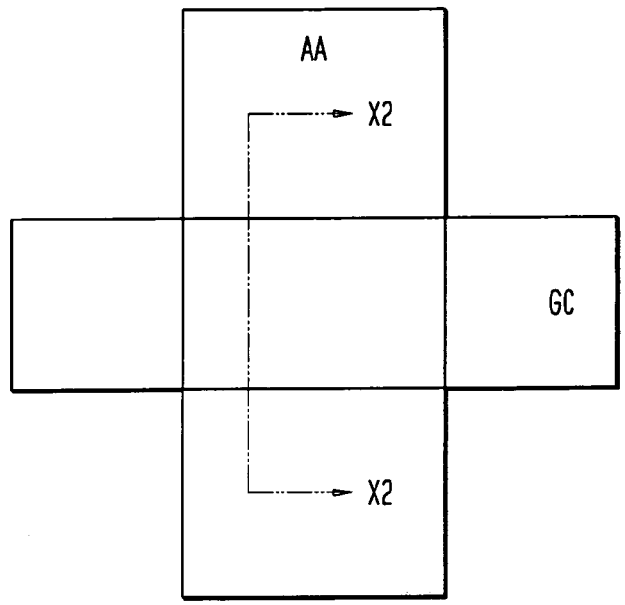
FIG. 9 illustrates a top view of a semiconductor logic device in accordance with another embodiment of the invention.

FIG. 9 is a top view of a logic device formed on a semiconductor substrate in accordance with the present invention. A process for forming the logic device will be described using the cross-sectional views in FIGS. 10A–10Q. The cross-sectional views will be taken with respect to line $X_2$—$X_2$ shown in FIG. 9. As shown in the figure, the gate contact region "GC" may be perpendicular to the active area "AA".

Figure 10A:
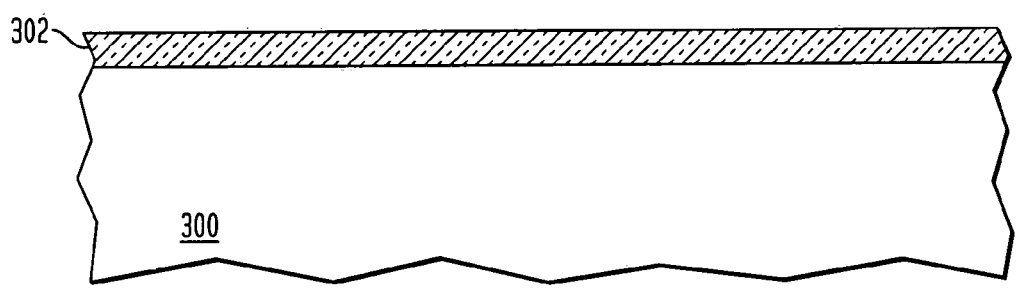
FIGS. 10A–10Q are cross-sectional views illustrating steps of a process for fabricating the semiconductor logic device shown in FIG. 9 in accordance with another aspect of the invention.

FIG. 10A illustrates a semiconductor substrate 300 at a step in the process of fabricating a logic device in accordance with the present invention. Disposed on top of the substrate 300 is a pad oxide 302. The pad oxide 302 may be thermally grown from the semiconductor substrate 300. Alternatively, the pad oxide 302 is formed by first depositing TEOS in a CVD process, such as by LPCVD, and then annealing the TEOS in oxygen. As with the pad oxide 204a of FIG. 3A, the pad oxide 302 is preferably about 50 Å thick.

Figure 10B:
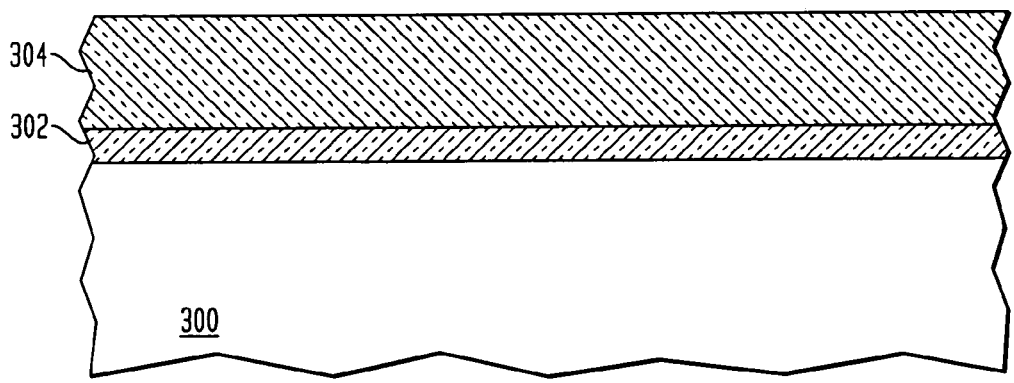

FIG. 10B illustrates the substrate 300 after a pad nitride 304 has been formed over the pad oxide 302. The pad nitride 304 is preferably about 1000 Å thick. The conventional isolation steps are performed to define the active area (AA) and a well implant is performed.

Figure 10C:
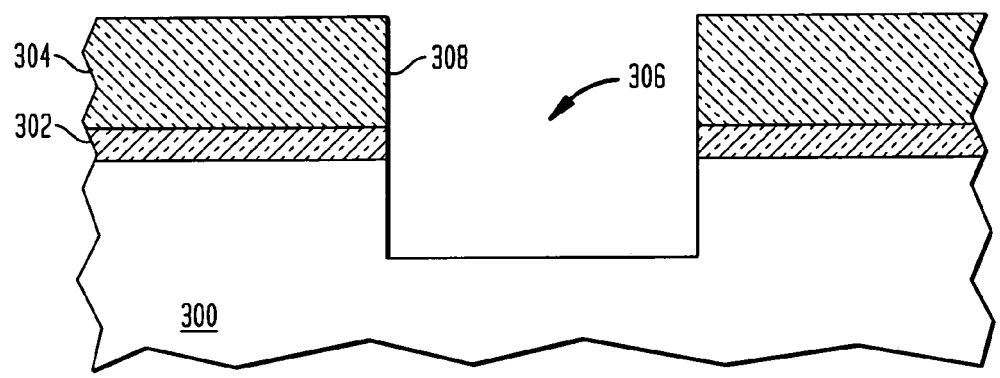

FIG. 10C illustrates the substrate 300 after a recess 306 is formed in the active area. The recess 306 is defined by sidewalls 308. The recess 306 may be formed by first applying a masking layer having an opening of a desired shape and size over the pad nitride 304. Then, an etching procedure, such as RIE or similar process, is performed to remove a portion of the pad nitride 304, the pad oxide 302 and the semiconductor substrate 300.

Figure 10D:
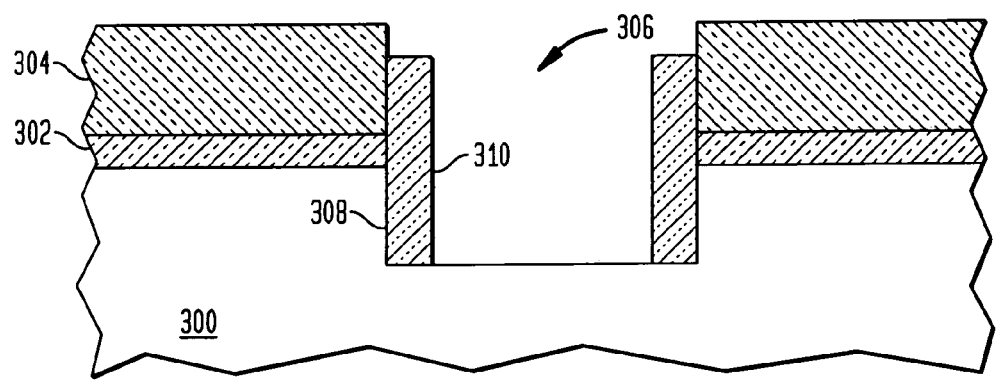

After the recess 306 is formed in the substrate 300, a doped spacer 310 may be formed along the sidewalls 308. The doped spacer 310 is preferably a glass, such as an arsenic doped glass (ASG) or a boron doped glass (BSG). The doped spacer 310 may be formed by a CVD process of the doped glass (ASG, BSG or the like) followed by a reactive ion etch (RIE) step to form the spacer 310, shown in FIG. 10D.

Figure 10E:
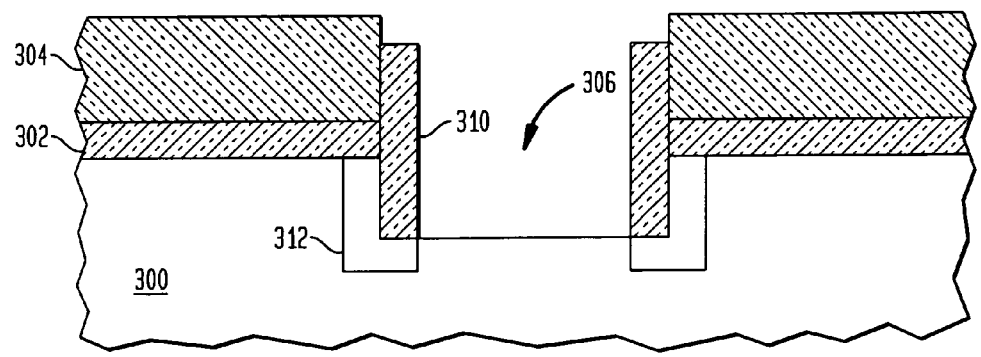

FIG. 10E illustrates a subsequent step in the process. After the doped spacer 310 is formed along the sidewalls 308 of the recess 306, the dopant within the doped spacer 310 may be diffused into the substrate 300 preferably by an annealing process which may also involve an oxidation step. The anneal step is typically carried out a temperature range of between 500° C. to 1000° C. After the dopant 312 has diffused out from the doped spacer 310 into the substrate 300, it preferably has an "L" shape, or more preferably has a shape that conforms to the sidewall 308 and an adjacent portion of the bottom of the recess 306.

Figure 10F:
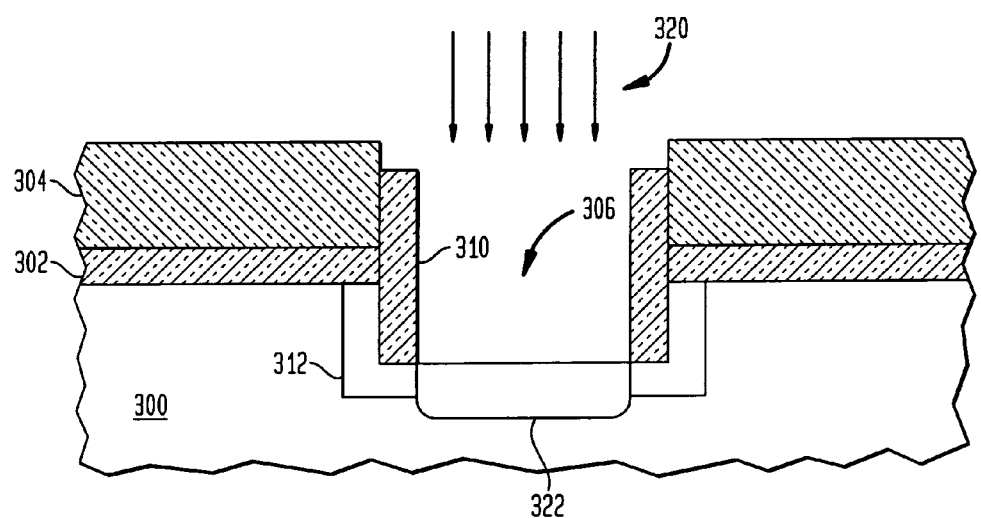

FIG. 10F illustrates a subsequent step in which a threshold voltage implant 322 is preferably carried out in the manner shown by the arrows 320. To form an n-type FET, the implanted species is an acceptor species such as boron or indium. For a p-type FET, the implanted species is a donor species such as antimony, phosphorus or arsenic. Additionally, species of either type may be implanted to set the requisite threshold voltage of the device.

Figure 10G:
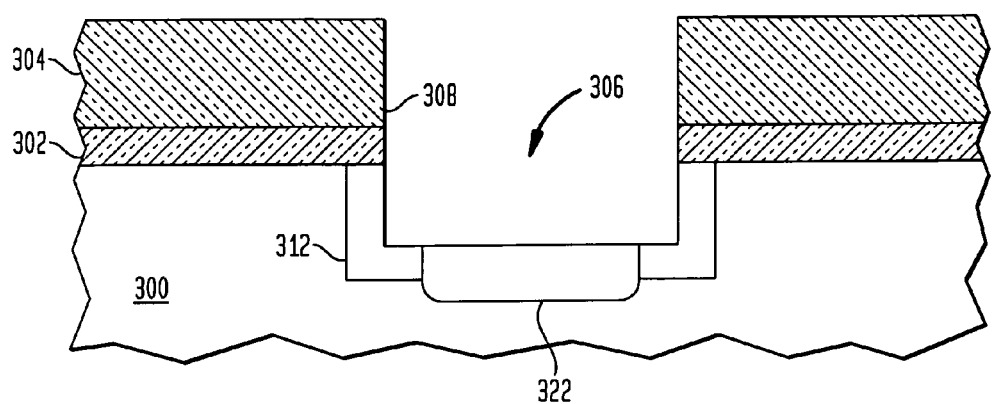

FIG. 10G illustrates an ensuing step wherein the doped spacer 310 is removed from the recess 306. This step is typically done by a wet etch in an HF based chemistry or by using an HF vapor.

Figure 10H:
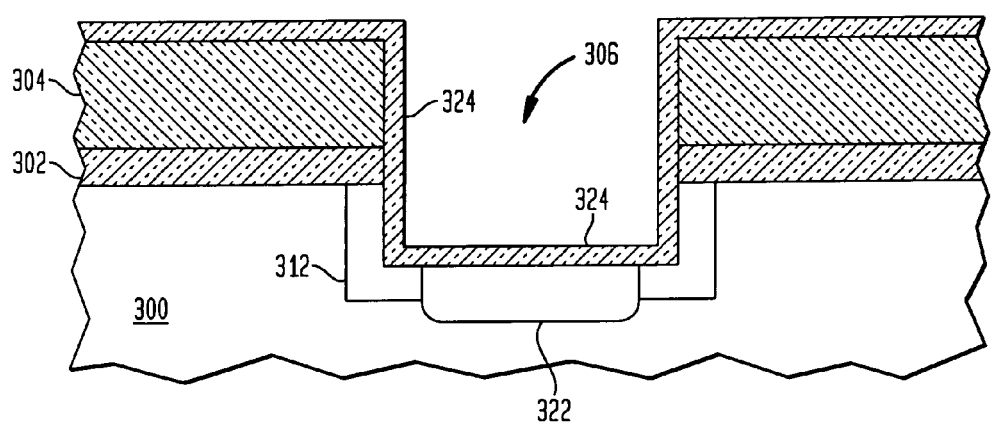

FIG. 10H illustrates a subsequent step wherein an oxide 324 is formed along exposed surfaces of the pad nitride 304, the sidewalls 308 and the bottom of the recess 306. An oxidation step is preferably performed here using steam oxidation as described above.

Figure 10I:
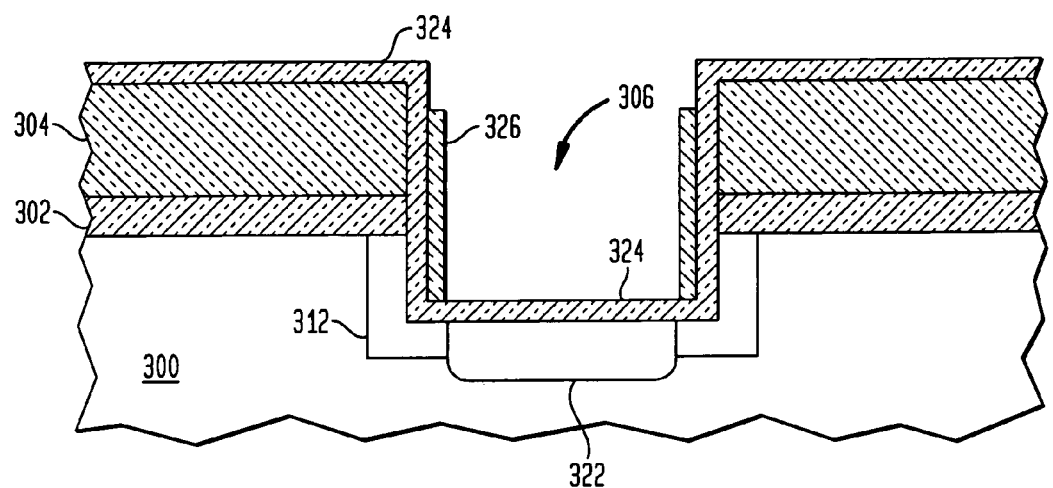

Subsequent to the oxide 324 being formed along the exposed surfaces, a spacer 326 is formed within the recess 306. As shown in FIG. 10I, the spacer 326 is preferably disposed over the oxide 324 on the sidewalls 308 of the recess 306. The spacer 326 is preferably a nitride or, alternatively, a nitride plus an oxide. The spacer 326 is preferably formed by chemical vapor deposition (CVD), nitridation, oxidation or a combination of the same in a manner similar to that of the first embodiment of this invention. The spacer 326 is typically thinner than the doped spacer 310 to ensure overlap of the extension. As is known in the art, when the subsequent diffusion of the extension guarantees an overlap, the spacer can be thinner. Because the heavily-doped threshold implants 322 are formed by the thicker spacers 310 and away from the extensions 312, a lower junction capacitance is achieved which improves the logic device performance.

Figure 10J:
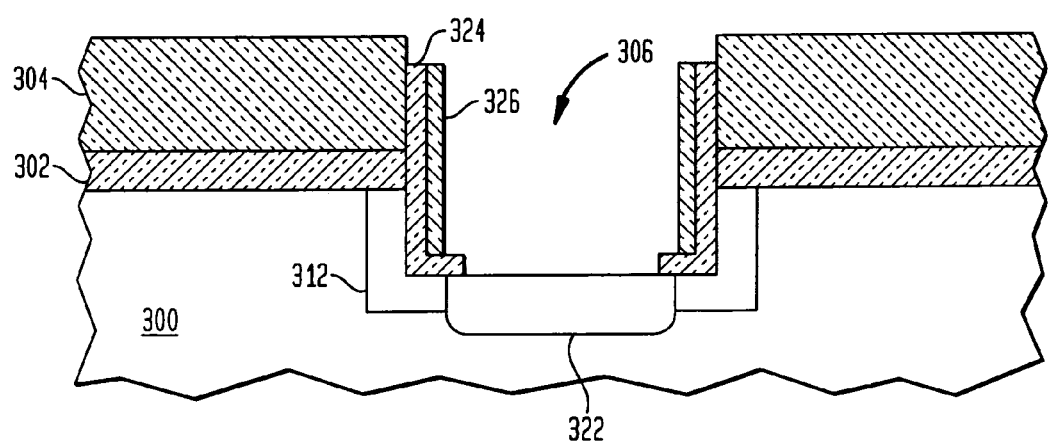

FIG. 10J illustrates a subsequent step wherein the oxide 324 that is not covered by the spacer 326 is removed. The process of removing the oxide 324 is equivalent to the process described above with regard to the removal of the oxide 240 shown in FIG. 3F.

Figure 10K:
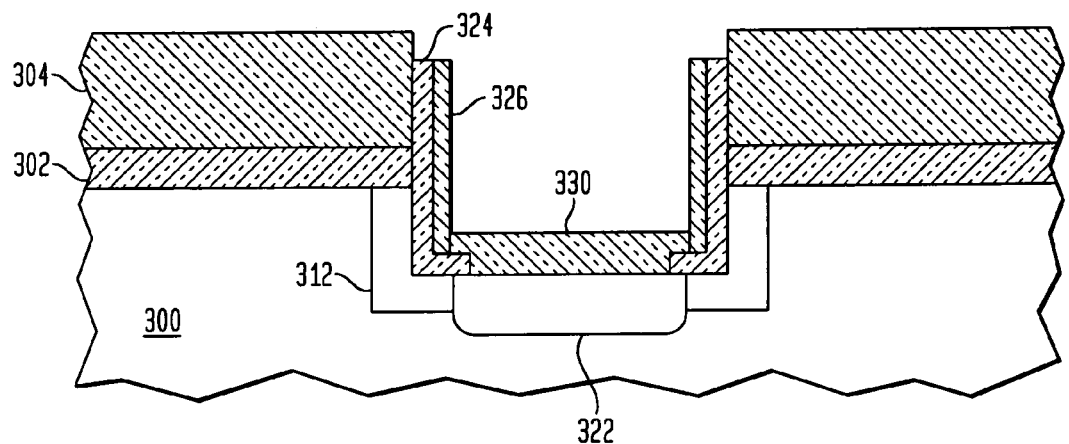

Next, as shown in FIG. 10K, a gate dielectric 330 is preferably formed within the recess 306. The gate dielectric 330 is preferably disposed over the threshold voltage implant 322 and surrounded on either side by the spacer 326. The gate dielectric 330 is either a thin thermally-grown oxide or a high-K dielectric which is comprised of any of the materials such as $Al_2O_3$, $HfO_3$, $ZnO_2$ oxynitrides of Hf, Zn, Al or laminates of the same as have been described in the literature.

Figure 10L:
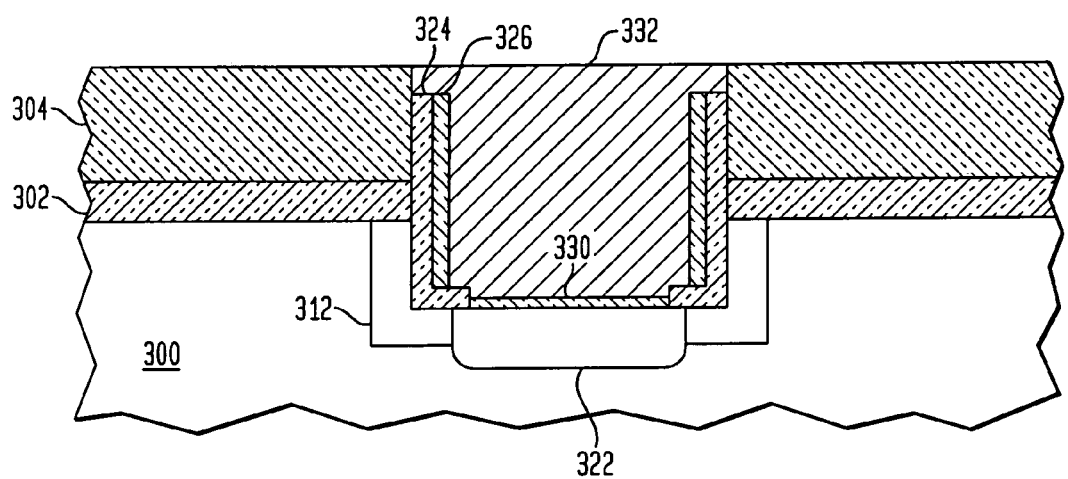

After the gate dielectric 330 has been formed, a gate conductor 332 may be formed within the recess 306, as shown in FIG. 10L. The gate conductor 332 preferably comprises a metal or doped polysilicon or a combination of the two. The gate conductor 332 may be formed as described above in relation to the gate conductor 230 of FIG. 3C. After the gate conductor 332 is formed, it is preferably planarized using, for example, CMP.

Figure 10M:
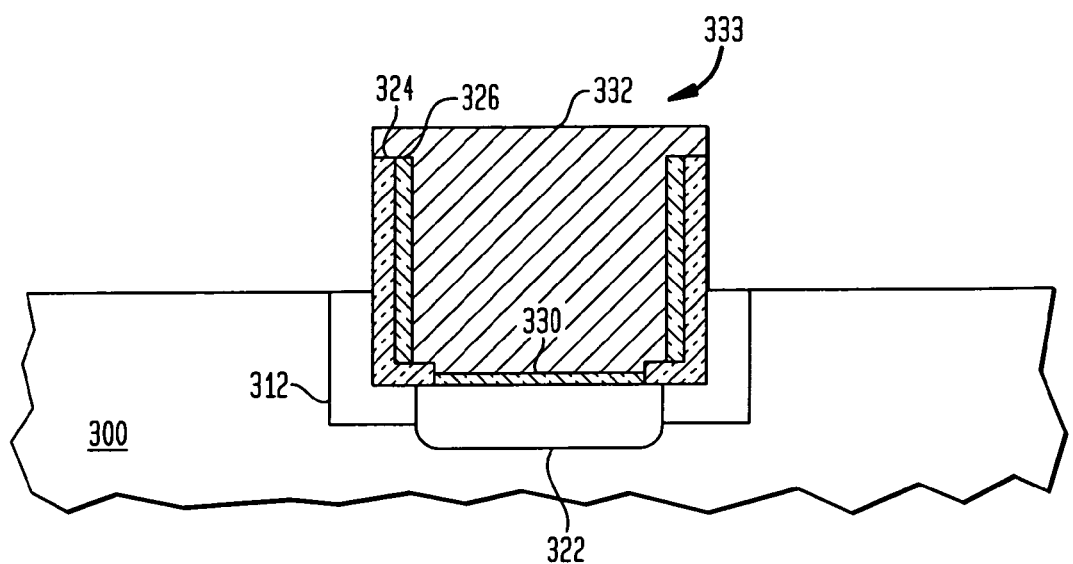

FIG. 10M illustrates a subsequent step after the gate conductor 332 has been formed. As shown, the pad nitride 304 and the pad oxide 302 are removed. The pad nitride is removed by etching in a hot phosphorus acid-based solution or by etching in an HF-ethylene glycol solution. The pad oxide is then removed by an HF-based solution. The gate conductor 332, the oxide 324 and the spacer 326 define a gate region 332.

Figure 10N:
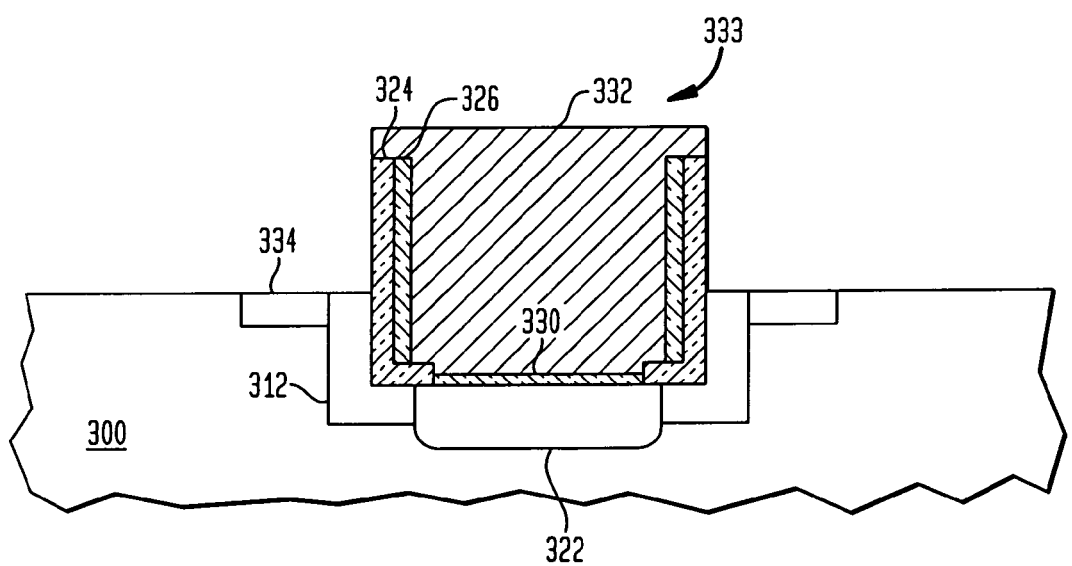

Next, as shown in FIG. 10N, extension implants 334 are preferably formed by implantation of ions on either side of the region 312 near the surface of the substrate 300. The extensions 334 are heavily doped and are of the same species type acceptor/donor as that of the region 312.

Figure 10O:
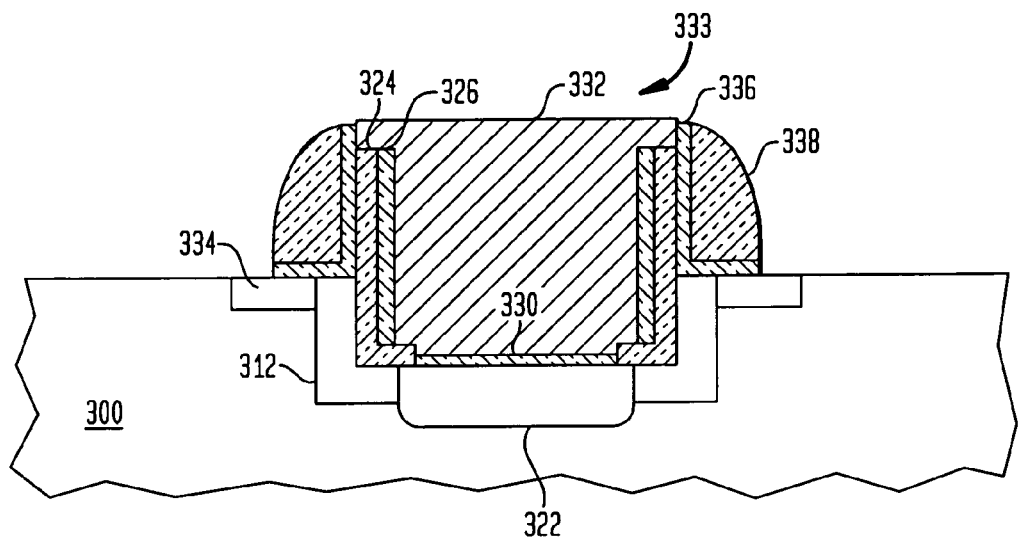

FIG. 10O illustrates subsequent processing wherein a nitride spacer 336 and an oxide spacer 338 are formed as is typical in logic device formation by methods known in the art.

Figure 10P:
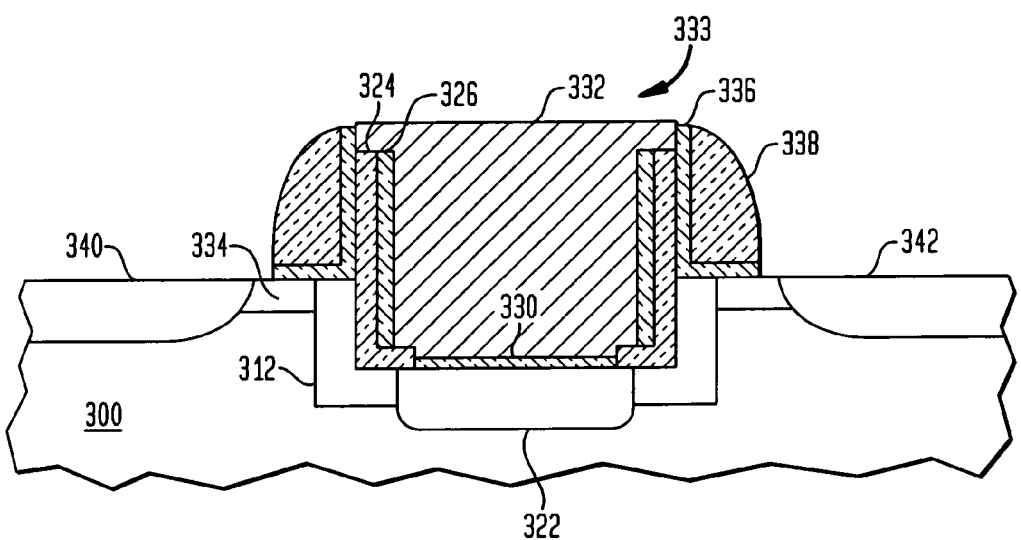

FIG. 10P illustrates a further step wherein heavily doped source and drain regions 340 and 342 are formed in the semiconductor substrate 300. The source (or drain) region 340 and the drain (or source) region 342 may be formed by dopant implantations and are subsequently silicided using cobalt or nickel as is known in the art.

Figure 10Q:
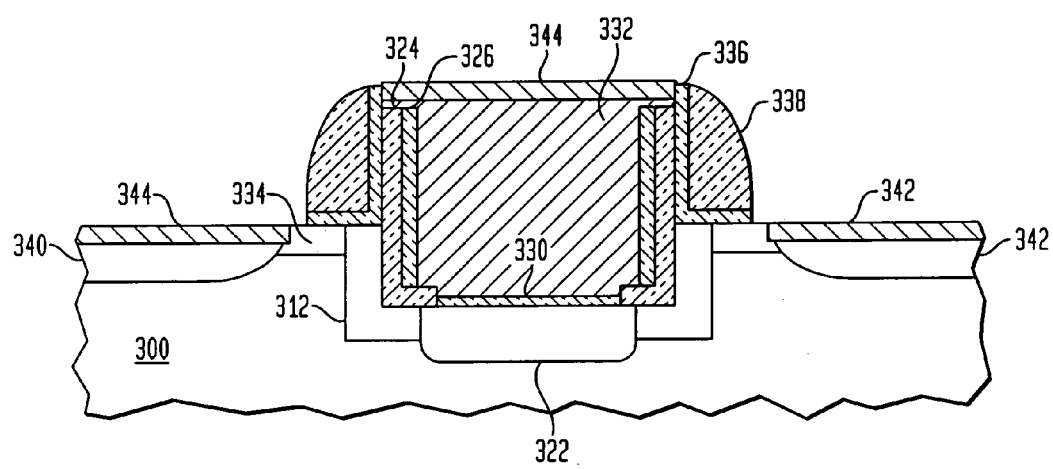

FIG. 10Q illustrates a subsequent step wherein a silicide 334 is formed over the source and drain regions 340 and 342 as well as along the top of the gate conductor 332 when the top is exposed polysilicon. The silicide 344 may be, by way of example, titanium silicide ($TiSi_2$), cobalt silicide ($CoSi_2$), nickel silicide (NiSi), tantalum silicide ($TaSi_2$), or platinum silicide ($PtSi_2$) as is known in the art. The logic device of FIG. 10Q is a damascene logic device and allows for low temperature formation after the gate dielectric is formed.

Although the invention herein has been described with reference to particular embodiments, it is to be understood that these embodiments are merely illustrative of the principles and applications of the present invention. In particular, the present invention has been described above in relation to embodiments for memory cells and logic devices, however other configurations are possible. It is therefore to be understood that numerous modifications may be made to the illustrative embodiments and that other arrangements may be devised without departing from the spirit and scope of the present invention as defined by the appended claims.

What is claimed is:

1. A method of fabricating a semiconductor device, said method comprising:
   providing a semiconductor substrate;
   defining a gate area in the substrate, the gate area having a sidewall extending into the substrate;
   forming a gate material within the gate area, the gate material having a top surface;
   oxidizing the sidewall and the top surface;
   forming a spacer within the gate area adjacent to the oxidized sidewall and a portion of the oxidized top surface; and
   removing segments of the oxidized sidewall and the oxidized top surface which are not covered by the spacer, wherein the spacer and remaining portions of the oxidized sidewall and the oxidized top surface form an encapsulated spacer.

2. The method according to claim 1, further comprising sputtering silicon over the oxidized sidewall and the oxidized top surface prior to forming the spacer.

3. The method according to claim 1, wherein the spacer comprises a nitride.

4. The method according to claim 3, wherein the spacer is formed by:
   depositing nitride within the gate area; and
   performing an etch-back selective to oxide.

5. The method according to claim 1, further including forming a pad stack on an upper surface of the substrate, the pad stack being adjacent to the gate area and including a pad oxide and a pad nitride, an edge of the pad stack forming the sidewall, wherein oxidizing the sidewall oxidizes the edge of the pad stack.

6. The method according to claim 1, wherein the oxidizing step is a steam oxidation step.

7. A method of fabricating a semiconductor device, said method comprising:
   providing a substrate;
   defining a gate area in the substrate, the gate area having sidewalls and a bottom linking the sidewalls, the sidewalls extending into the substrate;
   depositing a doped material within the gate area, the doped material being formed along a first one of the sidewalls and over an adjacent portion of the bottom;
   diffusing dopant from the doped material into the substrate;
   removing the doped material;
   oxidizing exposed portions of the sidewalls and the bottom of the gate area;
   forming a spacer within the gate area, the spacer covering a segment of one of the oxidized sidewalls and covering a segment of the oxidized bottom; and
   removing portions of the oxidized sidewalls and the oxidized bottom which are not covered by the spacer, wherein the spacer and remaining portions of the oxidized sidewalls and the oxidized bottom form an encapsulated spacer.

8. The method according to claim 7, further comprising:
   applying a threshold voltage adjust implant to the substrate through the bottom of the gate area after diffusing the dopant;
   forming a gate dielectric over the bottom of the gate area after any oxidized portion has been removed; and
   forming a gate conductor within the gate area over the gate dielectric.

9. The method according to claim 8, further comprising:
   forming an exterior spacer adjacent to each of the oxidized sidewalls; and
   forming source and drain regions in the substrate on either side of the gate area.

10. The method according to claim 9, further including forming an extension implant between each of the source and drain regions and the dopant.

11. The method according to claim 9, further including silicidation of exposed surfaces of the source and drain regions and the gate conductor.

12. The method according to claim 7, wherein the spacer comprises a nitride.

13. The method according to claim 7, further including forming pad stacks on an upper surface of the substrate, the pad stacks being on either side of the gate area and each including a pad oxide and a pad nitride, an edge of each pad stack forming the sidewalls, wherein oxidizing the sidewalls oxidizes the edges of the pad stack.

* * * * *